(12) United States Patent
Kamigaichi

(10) Patent No.: US 9,172,218 B2
(45) Date of Patent: Oct. 27, 2015

(54) ELECTRICAL JUNCTION BOX

(75) Inventor: Shungo Kamigaichi, Hiroshima (JP)

(73) Assignee: Yazaki Corporation, Minato-ku, Tokyo (JP)

( * ) Notice: Subject to any disclaimer, the term of this patent is extended or adjusted under 35 U.S.C. 154(b) by 0 days.

(21) Appl. No.: 14/007,366

(22) PCT Filed: Mar. 23, 2012

(86) PCT No.: PCT/JP2012/057630
§ 371 (c)(1),
(2), (4) Date: Jan. 17, 2014

(87) PCT Pub. No.: WO2012/133243
PCT Pub. Date: Oct. 4, 2012

(65) Prior Publication Data
US 2014/0126115 A1    May 8, 2014

(30) Foreign Application Priority Data
Mar. 25, 2011 (JP) .................................. 2011-068353

(51) Int. Cl.
*H02G 3/08* (2006.01)
*H02G 3/14* (2006.01)
*H02B 1/01* (2006.01)
(Continued)

(52) U.S. Cl.
CPC ................ *H02B 1/01* (2013.01); *H02G 3/081* (2013.01); *H05K 7/026* (2013.01); *B60R 16/0238* (2013.01); *H02G 3/088* (2013.01)

(58) Field of Classification Search
CPC ......... H05K 7/00; H01R 9/223; H02G 3/081; H02G 3/14; H02G 3/08; B60R 16/0238; B60R 16/0239

USPC ................ 174/50, 50.51, 50.54, 58–61, 520, 174/559–561; 248/906; 361/600, 622; 439/76.2
See application file for complete search history.

(56) References Cited

U.S. PATENT DOCUMENTS 4,940,419 A * 7/1990 Kurita et al. .................. 439/271
5,473,507 A * 12/1995 Schwegler et al. ........... 361/690
6,008,454 A   12/1999 Kawakita
(Continued)

FOREIGN PATENT DOCUMENTS

CN    201639227 U    11/2010
EP     0860923 A1     8/1998
(Continued)

OTHER PUBLICATIONS

International Search Report issued in corresponding International Application No. PCT/JP2012/057630 mailed Jun. 12, 2012.
(Continued)

*Primary Examiner* — Angel R Estrada
*Assistant Examiner* — Dimary Lopez Cruz
(74) *Attorney, Agent, or Firm* — Banner & Witcoff, Ltd.

(57) ABSTRACT

An electrical junction box of the present invention includes a frame (11) in which a storing box B is formed which has a unit storing room (20) in which an electronic control unit (63) is accommodated, and an upper cover (15) which is assembled to the side of the frame (11) where a accommodating port (20a), which becomes an entrance when the electronic control unit (63) is accommodated in the unit storing room (20), is formed so that the accommodating port (20a) is closed.

7 Claims, 12 Drawing Sheets

(51) Int. Cl.
*H05K 7/02* (2006.01)
*B60R 16/023* (2006.01)

(56) References Cited

U.S. PATENT DOCUMENTS

| | | | | |
|---|---|---|---|---|
| 6,108,202 | A | * | 8/2000 | Sumida ......................... 361/690 |
| 6,655,093 | B1 | * | 12/2003 | Gavin ............................... 52/20 |
| 2005/0115727 | A1 | | 6/2005 | Sakata |
| 2009/0096132 | A1 | | 4/2009 | Yamamoto |

FOREIGN PATENT DOCUMENTS

| | | |
|---|---|---|
| EP | 1527956 A1 | 5/2005 |
| JP | H11-308733 A | 11/1999 |
| JP | 2000-197241 A | 7/2000 |
| JP | 2002-305827 A | 10/2002 |
| JP | 2009-100533 A | 5/2009 |

OTHER PUBLICATIONS

English translation of the Written Opinion issued in PCT/JP2012/057630 mailed on Jun. 12, 2012.

Nov. 24, 2014—(EP) Extended European Search Report for application No. 12765615.5.

May 19, 2015—(JP) Notifications of Reasons for Refusal—App 2011-068353.

Sep. 6, 2015—(CN) Notification of the First Office Action—App 201280015202.2, Eng Tran.

* cited by examiner

ELECTRICAL JUNCTION BOX

TECHNICAL FIELD

The present invention relates to an electrical junction box which is carried in an automobile or the like, and which includes a unit storing room to accommodate an electronic control unit.

BACKGROUND ART

Traditionally, a type of electrical junction box which has a unit storing room that accommodates an electronic control unit including electrical control components is proposed (refer to a patent document 1). The electrical junction box has a storing room which accommodates a plurality of electric wires (harness) and connectors which are connected to the electronic control unit, besides the unit storing room which accommodates the electronic control unit. The electrical junction box packs up these components compactly and is installed in a vehicle indoor room. When the electronic control unit is to be accommodated in the unit storing room, the electrical junction box in which the electric wires, connectors and the like are arranged in advance is prepared by the electrical manufacturer or the electric wire arranging dealer, and then, the electronic control unit is accommodated in the unit storing room of the electrical junction box by the automobile manufacturer.

CITATION LIST

Patent Documents

Patent Document 1: JP-A-2009-100533

SUMMARY OF INVENTION

Technical Problem

The traditional electrical junction box has the following problems that should be settled. That is, as described above, the automobile manufacturer connects the electric wires and the connectors to the electronic control unit, and installs the electronic control unit in the unit storing room. However, even after the electronic control unit is installed, an accommodating port (opening) of the unit storing room inside the electrical junction box is opened. Therefore, the heat that circuit elements of the electronic control unit generated leaks from the accommodating port to the outside of the unit storing room, and is further transmitted to the inside of the electrical junction box. Electrical components including the electric wires (harness) which are connected to the electronic control unit may be thermally damaged, for example, the quality of insulating coatings of the electric wires may deteriorate. Finally, there may be an adverse impact on various controls of the vehicle.

The present invention is made in view of the above situation, and an object of the present invention is to provide an electrical junction box so that by suitably blocking the opening of a unit storing room which accommodates an electronic control unit, the heat that the electronic control unit accommodated in the unit storing room produces can be prevented from leaking to the outside of the unit storing room, and insulation coatings of electric wires or electronic components, which are wired outside the unit storing room, can be effectively avoided from deteriorating thermally.

Solution to Problem

To achieve the previously described object, the storing box according to the present invention is characterized by the following (1) to (5).

(1) An electrical junction box, comprising:
a frame, in which a storing box including a unit storing room accommodating an electronic control unit is formed at a part of the frame; and
an upper cover which is assembled to one side of the frame where an accommodating port is formed so that the upper cover closes the accommodating port, the accommodating port being an entrance for accommodating the electronic control unit in the unit storing room.

(2) The electrical junction box according to the above (1), wherein
the upper cover includes an upper cover body which closes the side of the frame where the accommodating port is formed, and a separating wall which is protruded to the frame from an inner surface of the upper cover body opposing the frame, and
the accommodating port is covered by the upper cover body and the separating wall.

(3) The electrical junction box according to the above (2), wherein
the separating wall is protruded towards an inner edge of the accommodating port, and
a distal end of the separating wall contacts the inner edge.

(4) The electrical junction box according to the above (3), wherein
the separating wall is formed with a reinforcing rib having a ridge shape along a direction in which the upper cover is assembled to the frame.

(5) The electrical junction box according to the above (1), wherein
the frame includes a protruding wall which protrudes from an upper end of a side wall defining the unit storing room towards the upper cover, and
a distal end of the protruding wall contacts an inner surface of the upper cover opposing the frame.

According to the electrical junction box of the construction of the above (1), because the accommodating port of the unit storing room is covered by the upper cover, heat inside the unit storing room can be prevented from being emitted to the outside.

According to the electrical junction box of the construction of the above (2), the accommodating port can be closed by the upper cover only in a limited range near the accommodating port of the unit storing room. As a result, the volume of the sealed unit storing room can be decreased, which contributes to the downsizing of the electrical junction box. Because even if the separating wall is provided, the whole height of the upper cover hardly increases, the production expense of the upper cover can be controlled.

According to the electrical junction box of the construction of the above (3), the volume of the sealed unit storing room can be decreased, and the electrical junction box can be further downsized. Because the distal end of the separating wall is supported by the storing box, even if an external force towards the frame is applied to the upper cover which is assembled to the frame, for example, even if the top surface of the upper cover is pressed to the frame, the separating wall produces a repelling force against the external force. As a result, the upper cover can be prevented from being deformed.

According to the electrical junction box of the construction of the above (4), by reinforcing the strength of the separating wall, the repelling force that the separating wall produces against an external force applied to the upper cover increases. As a result, the upper cover can be further prevented from being deformed.

According to the electrical junction box of the construction of the above (5), the volume of the sealed unit storing room can be decreased, and the electrical junction box can be downsized. Because the distal end of the separating wall contacts the inner surface of the upper cover, even if an external force towards the frame is applied to the upper cover which is assembled to the frame, for example, even if the top surface of the upper cover is pressed to the frame, the separating wall produces a repelling force against the external force. As a result, the upper cover can be prevented from being deformed.

Advantageous Effects of Invention

According to the electrical junction box of the present invention, the heat that the electronic control unit accommodated in the unit storing room produces will not leak to the outside of the unit storing room, thermal deterioration or performance deterioration of insulation coatings of electric wires or electronic components, which are wired outside the unit storing room, can be avoided, and the electrical junction box can be downsized and the strength of the electrical junction box can be increased.

The present invention has been briefly described above. Further, details of the invention will become more apparent after the embodiments of the invention described below are read with reference to the accompanying figures.

DESCRIPTION OF EMBODIMENTS

The electrical junction box according to one embodiment of the present invention is described as follows with reference to FIGS. 1 to 19C. The electrical junction box according to the present embodiment includes a frame in which a storing box is formed which has a unit storing room in which an electronic control unit is accommodated, and an upper cover which is assembled to the side of the frame where a accommodating port, which becomes an entrance when the electronic control unit is accommodated in the unit storing room, is formed so that the accommodating port is closed.

Figure 1:
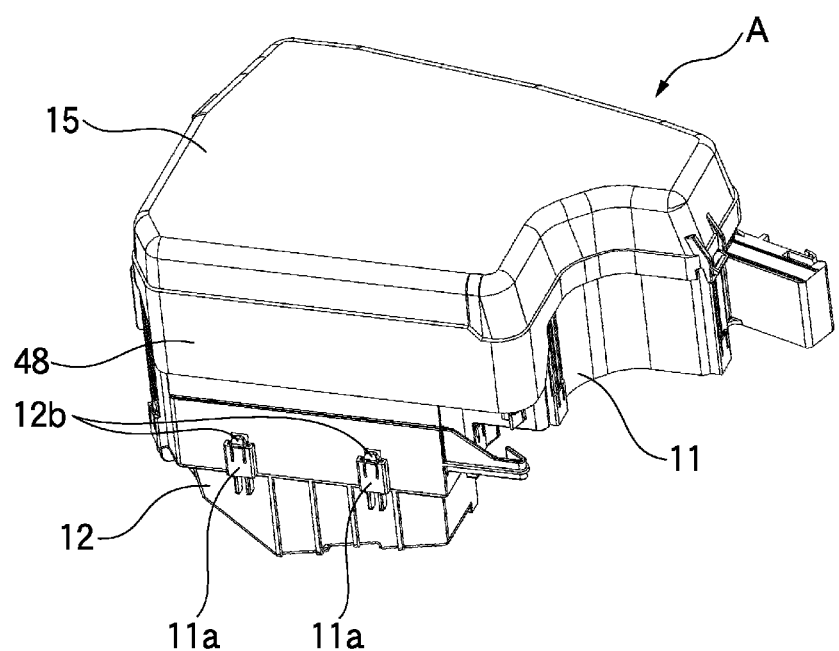
FIG. 1 is a perspective view of the electrical junction box (except a second lower member) according to an embodiment of the present invention.
Figure 2:
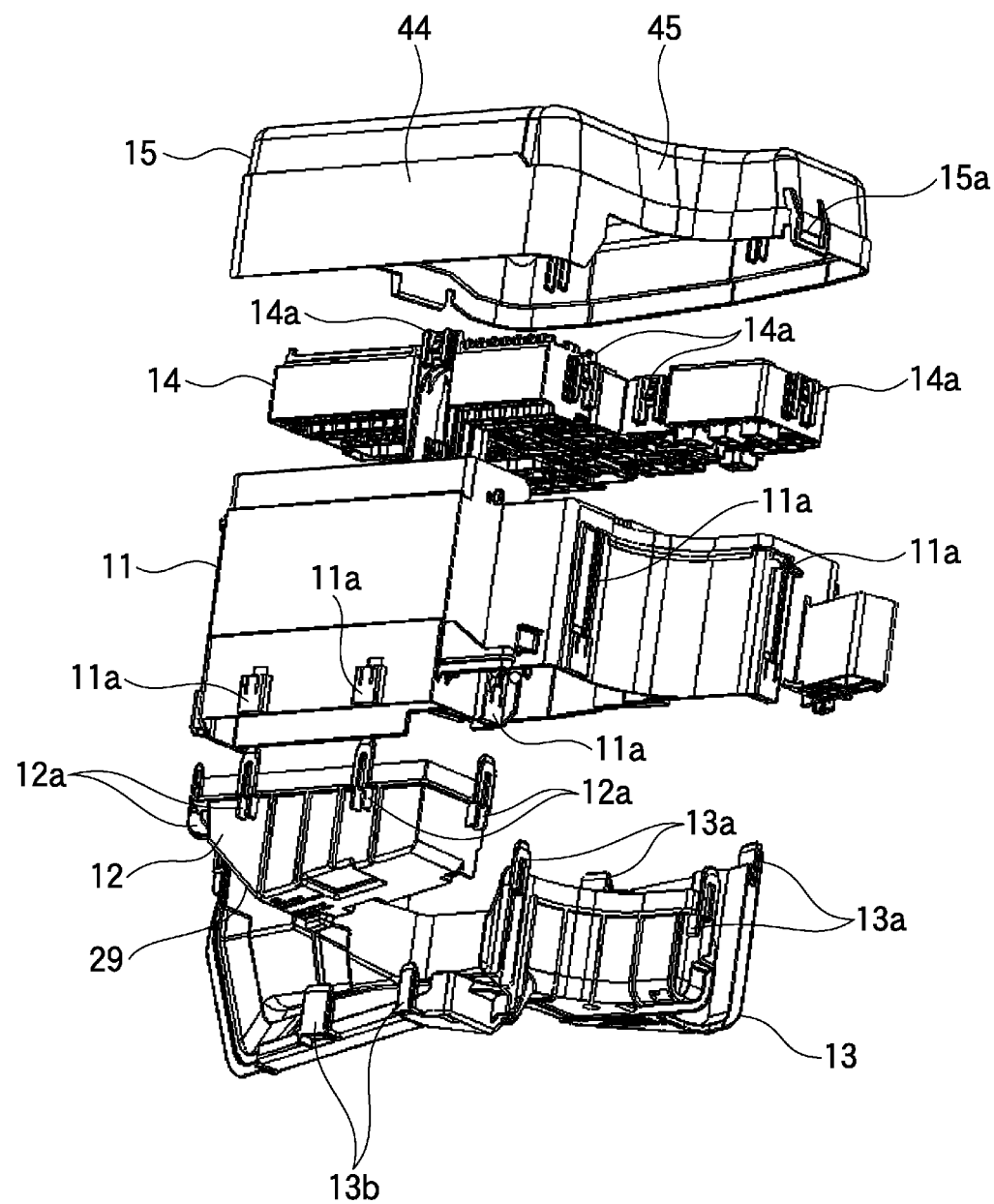
FIG. 2 is an exploded perspective view of the electrical junction box according to the embodiment of the present invention.
Figure 3:
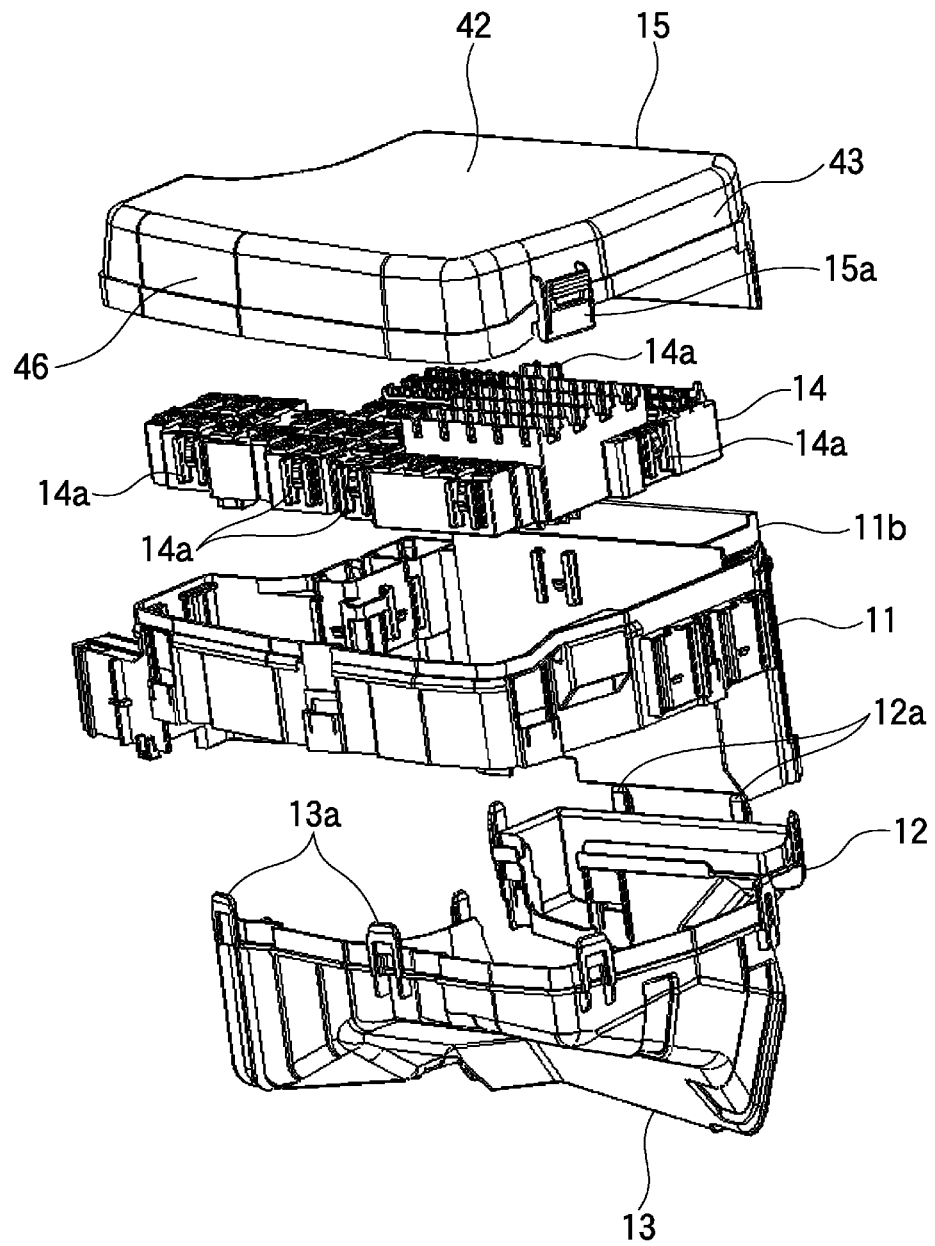
FIG. 3 is an exploded perspective view of the electrical junction box shown in FIG. 1 which is seen from a different direction.
Figure 4:
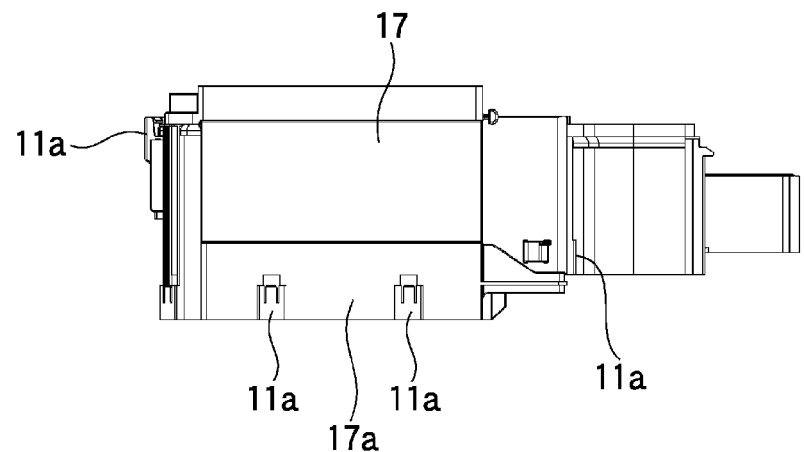
FIG. 4 is a front view of a frame of the electrical junction box according to the embodiment of the present invention.
Figure 5:
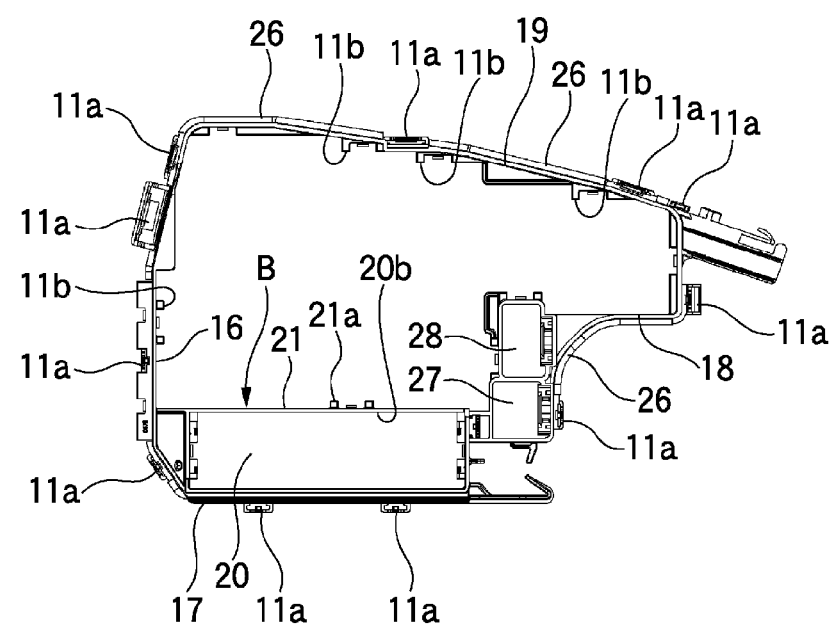
FIG. 5 is a top view of the frame of the electrical junction box according to the embodiment of the present invention.
Figure 6:
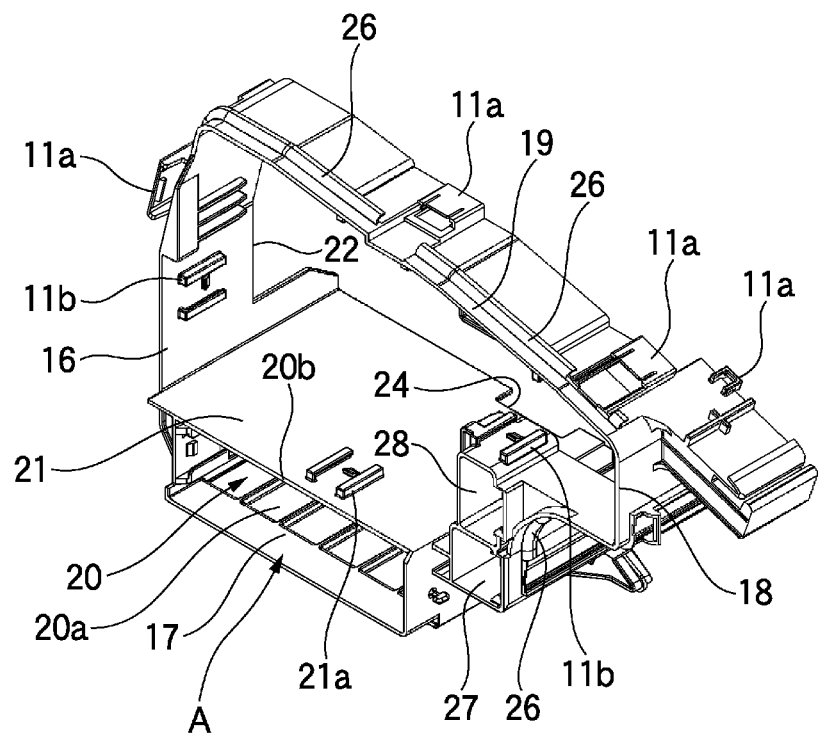
FIG. 6 is a perspective view of the frame of the electrical junction box according to the embodiment of the present invention which is seen obliquely from below.

As shown in FIGS. 1 to 3, an electrical junction box A of the embodiment includes a frame 11 as a storing box, a first lower member 12, a second lower member 13, a base member 14 and an upper cover 15. The frame (storing box) 11, the first lower member 12, the second lower member 13, the base member 14 and the upper cover 15 are formed into predetermined shapes and sizes by using heat-resistant, insulative and tough material such as synthetic resin or in combination with metal materials. The electrical junction box A is formed when these members are integrally coupled by using coupling means (locking parts or locked parts) to be described below. As shown in FIGS. 4 to 6, among these members, the frame 11 is a circular body which is short in the up-down direction as a whole. The frame 11 has side walls 16, 17, 18 and 19, which make up the circular body, and the outer side surfaces of the side walls 16, 17, 18 and 19 are provided integrally with a plurality of locked parts 11a of the same size and shape. Each of the locked parts 11a may vary in size and shape. A plurality of locking parts 11b of different sizes and shapes are provided integrally with and protruded from the inner side surfaces of the side walls 16, 18 and 19.

The side walls 16 and 19 are curved outwards, the side wall 17 is flat, and the side wall 18 is curved into a substantially L shape as a whole. These side walls 16, 17, 18 and 19 are connected in a circle-shape. As shown in FIG. 4, when the side wall 17 and the opposed side wall 19 are compared in height, the side wall 17 is extended downward to be longer. Between the side wall 17 which includes an extended part 17a which is extended downward and the side wall 19, a separating wall 21 whose section is U-shaped (or whose section is a square) and which defines a unit storing room 20 is adjacently provided to the side wall 17. The separating wall 21 may be made of a metal plate which has a shielding function. A plurality of locking parts 11b of different sizes and shapes are provided integrally with and protruded from the inner side surfaces of the side walls 16, 18 and 19 which make up the circular body. Each of the locking parts 11b may have the same size and shape.

The separating wall 21 forms the storing box B which defines a unit storing room 20. The storing box B forms a space which is penetrated in the up-down direction as the unit storing room 20, and an entrance when an electronic control unit 63 is accommodated becomes a accommodating port 20a.

The separating wall 21 is protruded upwards a predetermined length from the upper ends of the side walls 16 and 17. When the upper cover 15 is assembled to the frame 11, the distal end (upper end) of the separating wall 21 contacts the distal end of a separating wall 49 of the upper cover 15 to be described later. With this construction, if an external force towards the frame 11 is applied onto the upper cover 15 which is assembled to the frame 11, for example, if a top part 42 of the upper cover 15 is pressed to the frame 11, the separating wall 21 which is supported by the separating wall 49 generates a repelling force against the pressing force (external force). As a result, the upper cover 15 can be prevented from being deformed.

The locking parts 11b, which the inner side surfaces of the side walls 16 to 19 of the frame 11 are provided with, and a locking part 21a, which the outer side surface of the separating wall 21 is provided with, are locked to locking projections (locked parts) 14a, which the outer side surfaces of the base member 14 are provided with. Thereby, the base member 14 is held in the frame 11. The locked parts 11a, which the outer side surfaces of the side walls 16 to 19 of the frame 11 are provided with, are locked to locking projections 12a and 13a to be described below, which the first lower member 12 and the second lower member 13 are provided with, respectively. Thereby, the first lower member 12 and the second lower member 13 are held to the frame 11.

A cut 22 through which electric wires (harness) to be described below are led in is formed at the lower part of the side wall 16. Furthermore, a cut 24 through which connector-attached electric wires are led into the unit storing room 20 from within the frame 11 is formed at the lower part of the separating wall 21.

Ribs 26, which support the lower edges of the upper cover 15 which closes the upper opening of the frame 11, are provided integrally with and protruded from the outer side surfaces of the upper part of the side wall 18 and a part of the upper part of the side wall 19. Connector storing frames 27 and 28, in which the connectors connected to electric wires which are stored in the frame 11 are installed, are provided at the inner side of the side wall 18.

Figure 7:
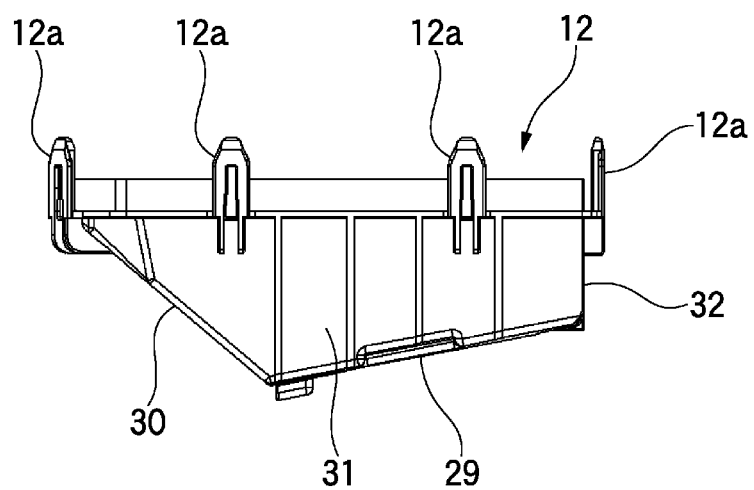
FIG. 7 is a front view of a first lower member of the electrical junction box according to the embodiment of the present invention.
Figure 8:
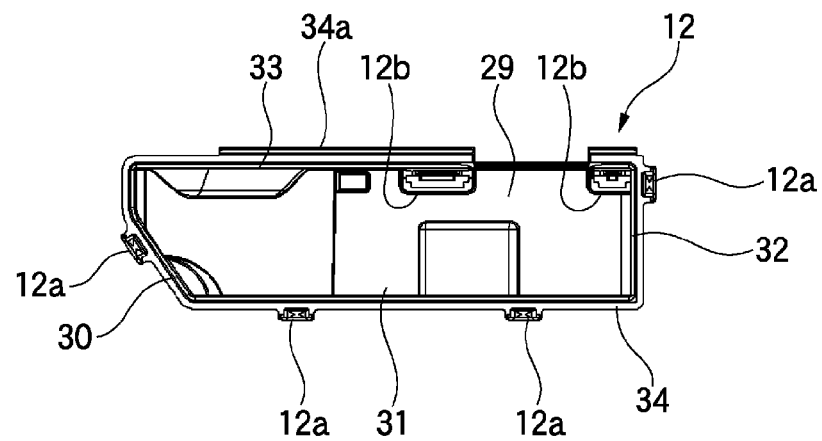
FIG. 8 is a top view of the first lower member of the electrical junction box according to the embodiment of the present invention.
Figure 9:
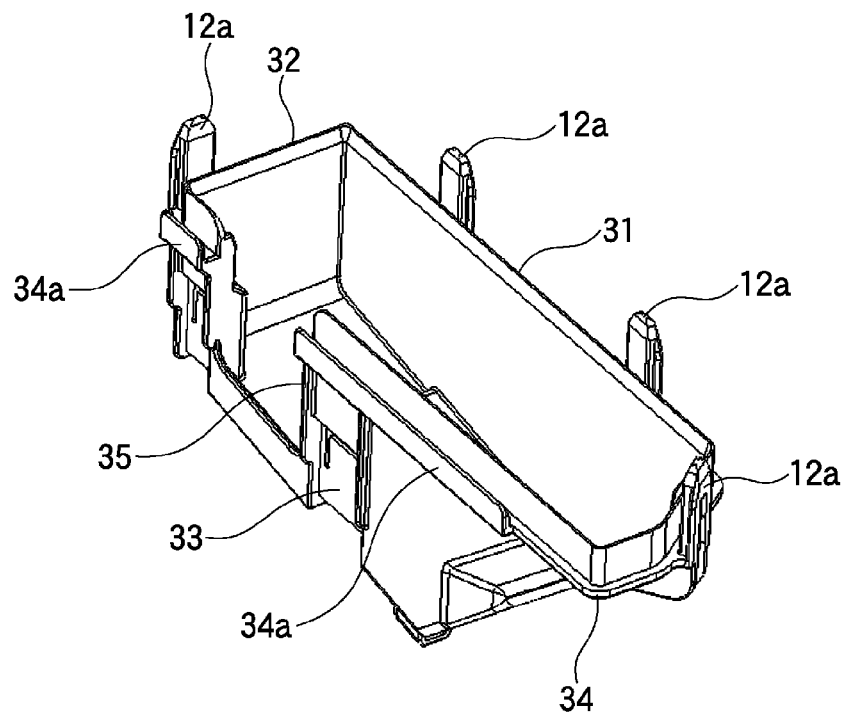
FIG. 9 is a perspective view of the first lower member shown in FIG. 7 which is seen from a different direction.

As shown in FIGS. 7 to 9, the first lower member 12 is a bottomed container which has such a shape that a bottom part 29 is concaved into a V-shape, and has a side wall 30, which is curved into a V-shape, that is, which has a part bended, and flat side walls 31 to 33. A rib 34 is protruded from the outer side surfaces of the side walls 30 to 33 at positions of the same distance from the upper ends of the side walls. The rib 34 functions to support the lower ends of the side walls 16 and 17 of the frame 11 whose lower part is attached to the first lower member 12. The locking projections 12a are integrally provided at predetermined positions on the side walls 30 to 32 along the rib 34. The locking projections 12a are provided at sites corresponding to those of the plurality of locked parts 11a on the frame 11. The locked parts 11a and the locking projections 12a are fitted to each other when the frame 11 and the first lower member 12 are coupled.

Figure 19A:
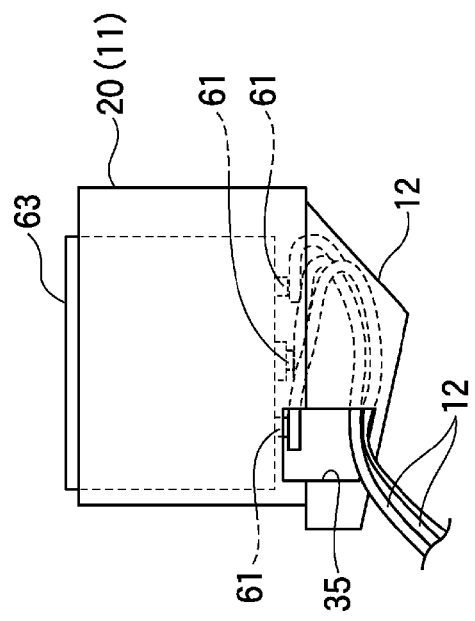
FIGS. 19A to 19C includes illustrative views which show the process of storing the electronic control unit that is extracted from and inserted into a unit storing room.
Figure 19B:
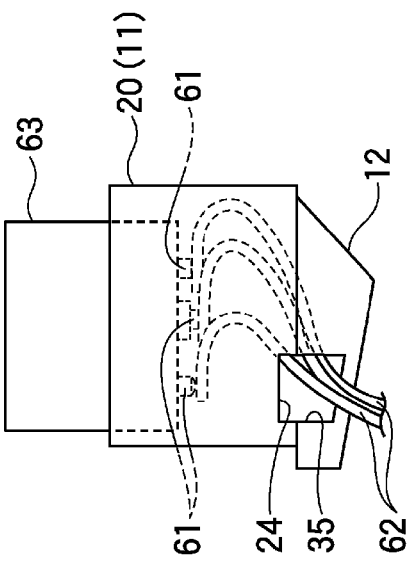
Figure 19C:
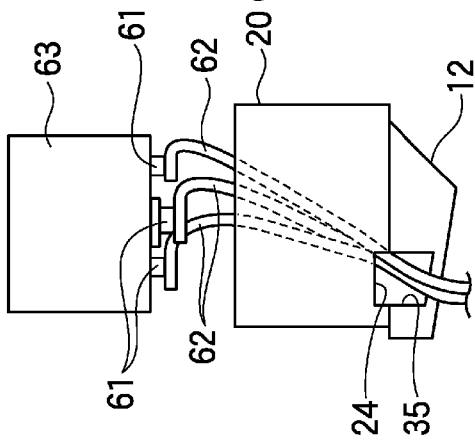

A cut 35 which has a slightly bigger opening is formed at the upper end of the side wall 33, and two (one is big and the other is small) locked parts 12b are provided integrally at the right and left sides of the cut 35. The cut 35 functions to guide the connector-attached electric wires (harness) which are led inside the first lower member 12 through the second lower member 13 which is provided adjacently to the first lower member 12 as shown in FIGS. 19A to 19C.

Figure 10:
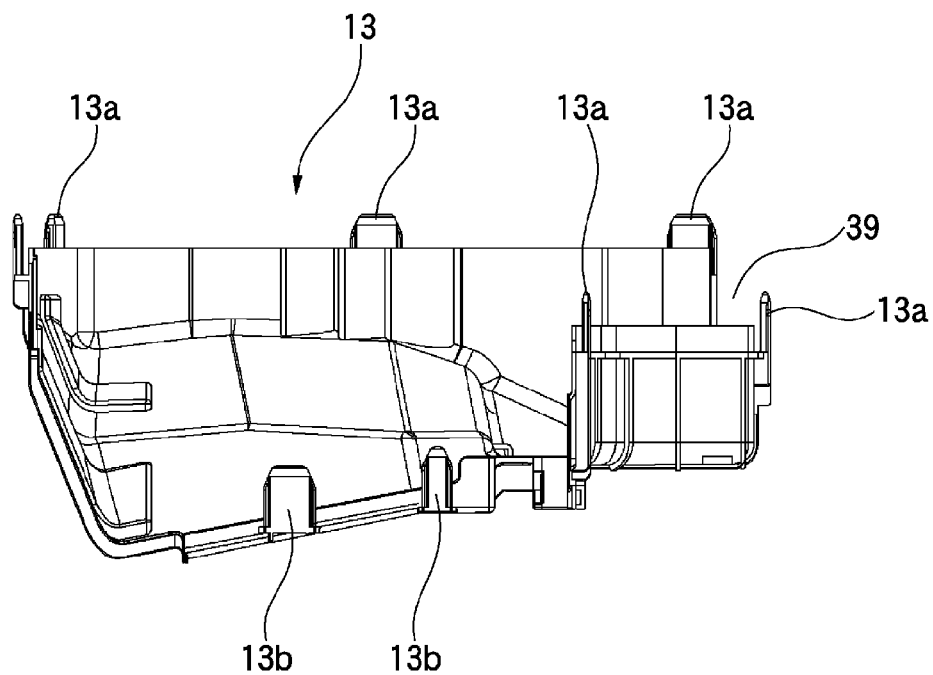
FIG. 10 is a front view of the second lower member of the electrical junction box according to the embodiment of the present invention.
Figure 11:
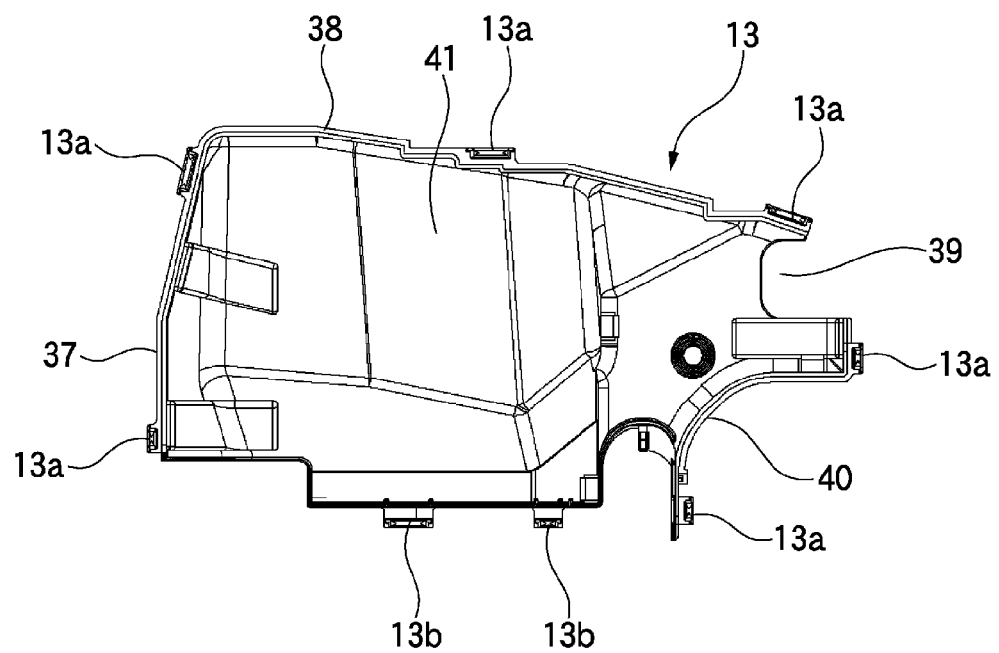
FIG. 11 is a top view of the second lower member of the electrical junction box according to the embodiment of the present invention.

The locked parts 12b are provided at sites corresponding to locking projections 13b which are protruded from the lower part of the lateral open end of the second lower member 13 as shown in FIGS. 10 and 11. When the first lower member 12 is connected to the second lower member 13, the locking projections 13b which are protruded from the second lower member 13 are fitted and connected to the locked parts 12b of the first lower member 12, respectively. The reference number 36 show a plurality of reinforcing ribs which are protruded from the outer side surface of the side wall 31 in the vertical direction so that the rib 34 is continued.

Raised pieces 34a are provided adjacently to the upper part of the outer side surface of the side wall 33 in the first lower member 12 to be raised up from the outer side edge of the rib 34. The raised pieces 34a function to give strength to resist the bending of the side wall 33 and to resist an external force accommodated from the separating wall 21 of the frame 11. Therefore, an operation of storing an electronic control unit to be described in the unit storing room 20 can be prevented from being hampered by the bending of the separating wall 21.

Thus, in the present embodiment, the lower member is divided in two parts: the first lower member 12 and the second lower member 13. The first lower member 12 communicates with the inside of the unit storing room 20 in the frame 11, and a space, which is shielded from the frame 11 except the unit storing room 20 and the second lower member 13, is formed. Thereby, the inside of the unit storing room 20 can be thermally shielded and separated from the outside, and the waterproofness and the strength can be improved. As a result, the stability and reliability of the electronic control unit accommodated in the unit storing room 20 can be secured. In this case, the lower edge of the separating wall 21 in the frame 11 is supported on the rib 34 between the side wall 33 of the first lower member 12 and the raised pieces 34a. Therefore, the separating wall 21 can be stably supported and can be prevented from being deformed in the horizontal direction.

FIGS. 10 and 11 show the second lower member 13 which has the locking projections 13b and locking projections 13a. The second lower member 13 is a bottomed container which is opened upwards and in the direction the first lower member 12 is coupled. The second lower member 13 has a side wall 37, a side wall 38, which is substantially L-shaped when viewed from top, an opening 39, an arc-shaped side wall 40 and a bottom part 41. The locking projections 13b may be locked to the locked parts 12b of the first lower member 12 which are arranged adjacently to the locking projections 13b, and the locking projections 13a may be locked to the locked parts 11a on the outer side surfaces of the frame 11. The side walls 37, 38, 40 and the bottom part 41 are reinforced by bending parts at a plurality of positions to each other.

The base member 14 is a board-like block in which electrical components mainly including a large number of connectors, fuses and relays are installed. The base member 14 has a plurality of locked parts 14a which the outer side surfaces of the block is integrally provided with. The base member 14 is made to have such a size and such a shape that the base member 14 may be stored in the frame 11 except the unit storing room 20. The locked parts 14a of the base member 14 may be fitted to the locking parts 11b at the inner side surfaces of the frame 11. The locked part 14a which is positioned at the front surface of the block may be locked to the locking part 21a of the separating wall 21.

Figure 12:
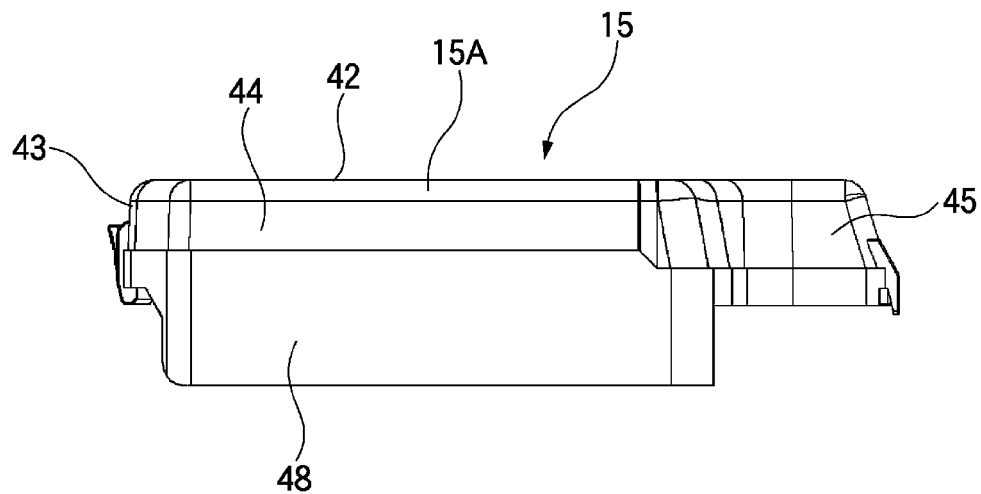
FIG. 12 is a front view of an upper cover of the electrical junction box according to the embodiment of the present invention.
Figure 13:
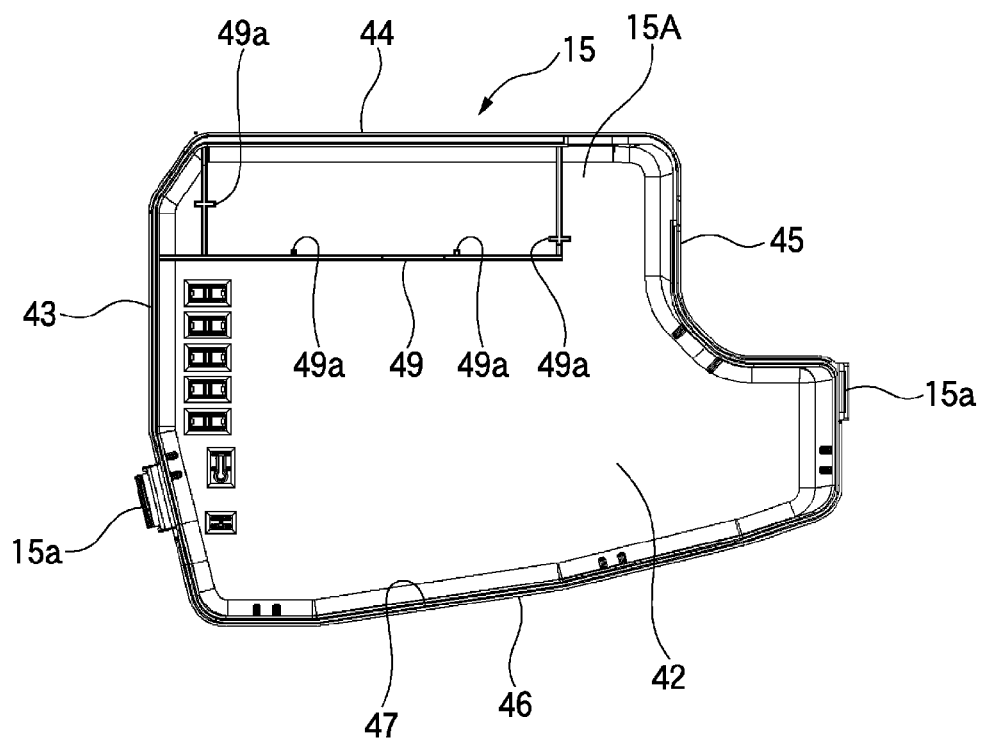
FIG. 13 is a bottom view of the upper cover of the electrical junction box according to the embodiment of the present invention.
Figure 14:
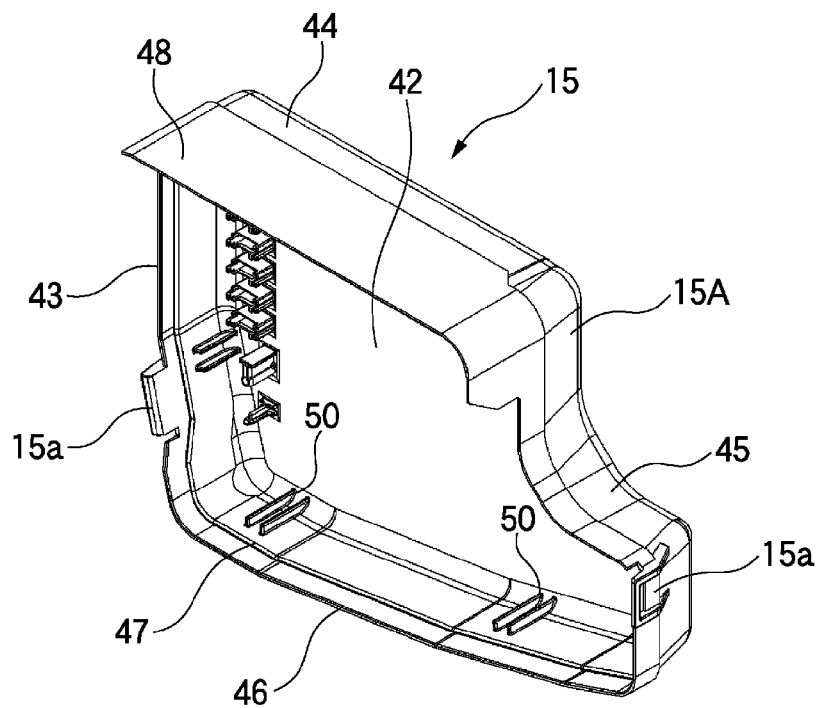
FIG. 14 is a perspective view of the upper cover of the electrical junction box according to the embodiment of the present invention which is seen obliquely from below.
Figure 15:
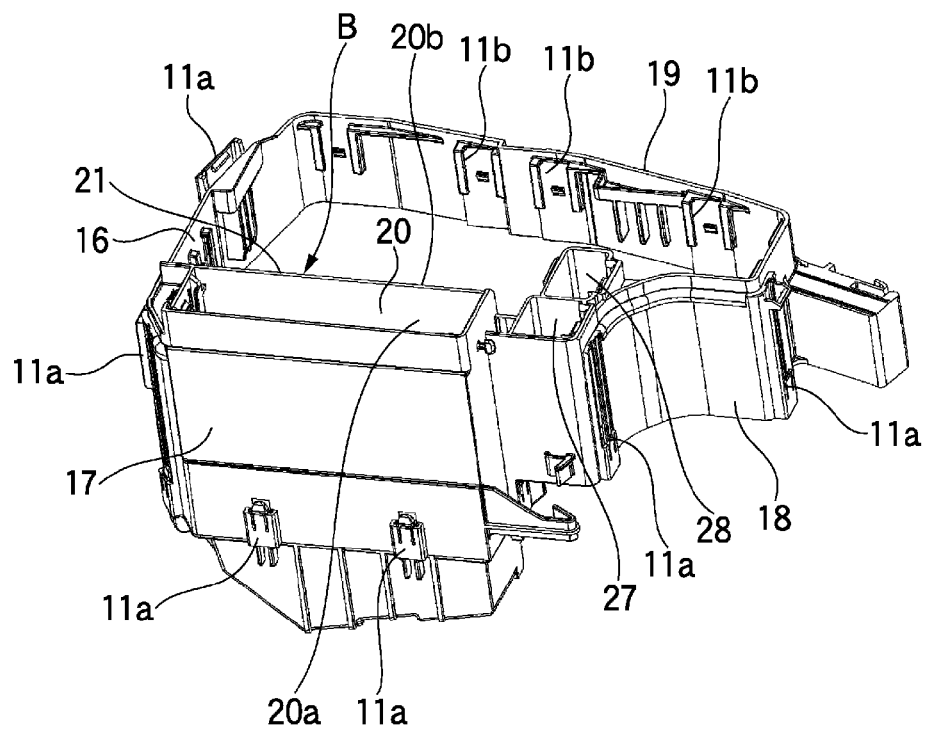
FIG. 15 is a perspective view which shows that the upper cover is removed from the electrical junction box shown in FIG. 1.
Figure 17:
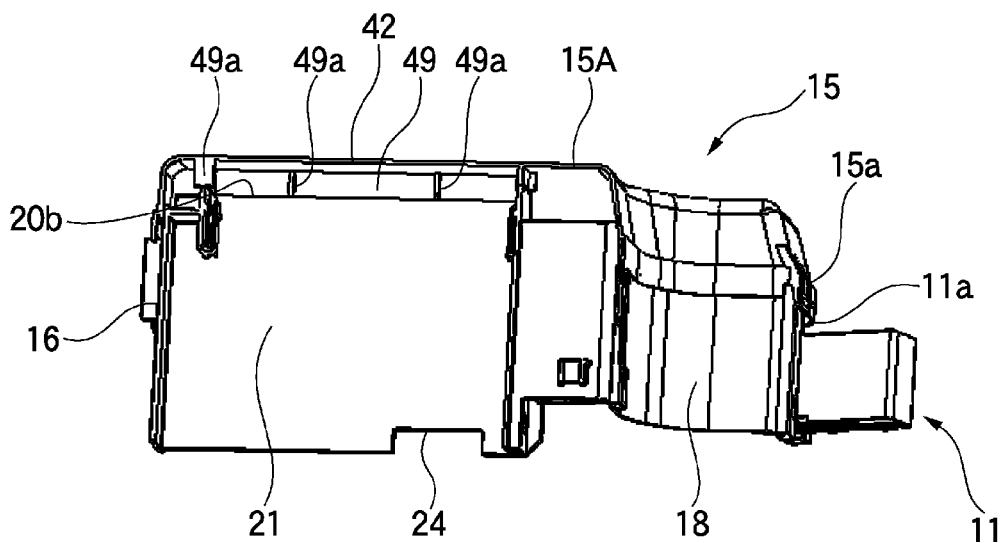
FIG. 17 is a perspective view which partially shows a section of the electrical junction box shown in FIG. 16 which is seen from an XVII-XVII line.

FIGS. 12 to 14 show the upper cover 15. The upper cover 15 includes an upper cover body 15A which closes the upper opening of the frame 11 and the accommodating port 20a which becomes an entrance when the electronic control unit 63 is accommodated in the unit storing room 20 and a separating wall 49. The separating wall 49 is protruded towards the frame 11 from the inner surface of the upper cover body 15A that faces the frame 11. As shown in FIG. 17, when the upper cover 15 is assembled to the frame 11, the distal end (upper end) of the separating wall 49 contacts the distal end of the separating wall 21 of the frame 11. Thereby, the accommodating port 20a of the unit storing room 20 is closed by the upper cover 15. Therefore, it can be avoided in advance that insulation coatings of neighboring electric wires or electronic components deteriorate thermally because the heat that electronic control unit 63 generates leaks outside.

Figure 18:
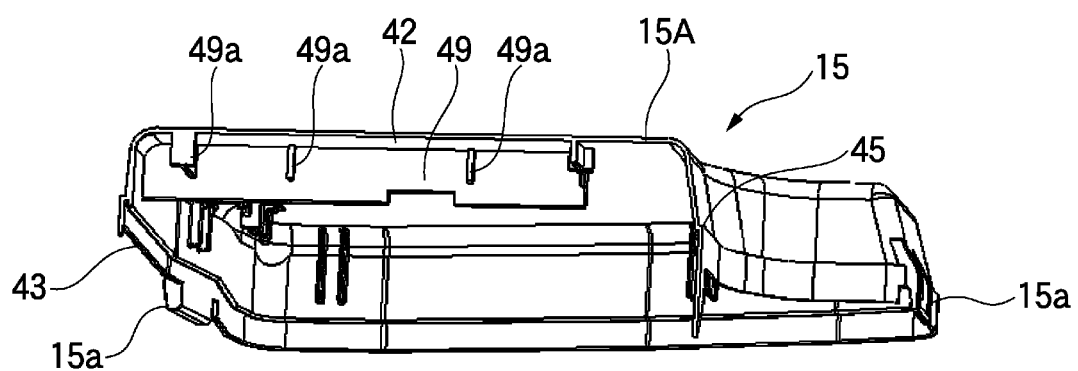
FIG. 18 is a perspective view which shows only the upper cover of the electrical junction box shown in FIG. 17.

As shown in FIG. 18, the separating wall 49 is protruded towards the distal end of the separating wall 21 of the frame 11 from the inner surface (bottom surface of the top part) of the upper cover 15 that faces the frame 11. Therefore, the accommodating port 20a of the unit storing room 20 is covered by the upper cover body 15A and the separating wall 49 only in the limited range near the accommodating port 20a of the unit storing room 20. As a result, the volume of the sealed unit storing room 20 can be downsized, which can contribute to the downsizing of the electrical junction box. Because even if the upper cover 15 is provided with the separating wall 49, the whole height of the upper cover 15 hardly increases, the production cost of the upper cover 15 can be controlled.

If the thickness of the separating wall 21, which defines the unit storing room 20, is ensured to some extent, the part near the distal end (lower end) of the separating wall 49 contacts an inner edge 20b of the separating wall 21 of the unit storing room 20 at the inner side of the accommodating port 20a. Thereby, the volume of the unit storing room 20 is decreased, and the size of the electrical junction box A including the frame 11 and the upper cover 15 can be further downsized.

Reinforcing ribs 49a of a ridge shape are formed on the separating wall 49 along the direction the upper cover 15 is assembled to the frame 11, and the strength of the separating wall 49 is raised. Thereby, the repelling force that the separating wall 49 produces against an external force applied to the upper cover 15 increases. As a result, the upper cover 15 can be further prevented from being deformed. In this case, the size, shape and number of the reinforcing ribs 49a can be arbitrarily selected. To increase the strength of a part of the upper cover 15 where stress is easy to be concentrated, for example, it is possible to make the reinforcing ribs 49a thicker or increase the number of the reinforcing ribs 49a.

The upper cover 15 includes the top part 42 and side walls 43 to 46 which are connected to each other around the top part 42. Among these parts, the top part 42 and the side wall 44 are substantially flatly formed, but the side walls 43 to 46 are formed to have shapes and sizes substantially corresponding to those of the side walls 16 to 19 of the frame 11 in a top view. The side wall 45 is substantially L-shaped as a whole in a top view and is connected with the side walls 43, 44, 46 to form a circle. Parts of the side wall 43 and the side wall 45 are provided with locking projections 15a, one for each side wall, so that the parts of the side walls 43 and 45 are protruded outwards. The locking projections 15a are provided at positions corresponding to the positions of the locked parts 11a, which the side wall 16 and the side wall 18 of the frame 11 are provided with, one for each side wall. Therefore, when the upper part of the frame 11 is covered by the upper cover 15, the locking projections 15a may be engaged with the locked parts 11a.

A step part 47 is continuously formed on the inner side surfaces of the side walls 43 to 46 of the upper cover 15 at positions of the same distance from the top part 42. The upper edges of the side walls 16 to 19 of the frame 11 may be accommodated by the step part 47 at the inner side surfaces of the side walls 43 to 46. That is, the upper cover 15 is installed stably on the frame 11 when the step part 47 is supported by the upper edges of the side walls 16 to 19. An extended wall 48 is extended downward from the lower parts of the side wall 44 and the part of the side wall 45 that is connected to the side wall 44.

The frame 11, the first lower member 12, the second lower member 13, the base member 14 and the upper cover 15 of such structures are assembled as follows. First, the first lower member 12 is arranged below the frame 11, and the lower end edges of the side walls 16 and 17 and the separating wall 21 of the frame 11 are supported on the rib 34 of the first lower member 12. The locking projections 12a, which the outer side surfaces of the first lower member 12 are provided with, are inserted into the locked parts 11a at the lower part of the frame 11. At this time, the lower edge of the separating wall 21 is on the rib 34 and is located between the raised pieces 34a and the side wall 33. Therefore, a pressure force which is applied to the separating wall 21 from a large number of bundled electric wires to be described below in the frame 11 can be prevented from affecting the unit storing room 20. That is, the separating wall 21 can be prevented from being bended.

Then, while the opening part side of the second lower member 13 is made to face the side wall 33 side of the first lower member 12, the two (big and small) lock projections 13b at the opening part side are inserted into the locked parts 12b of the first lower member 12 from below. Before or after the engagement of the locking projections 13b with the locked parts 12b, the locking projections 13a at the outer side surfaces of the second lower member 13 are inserted into and locked to the locked parts 11a at the outer side surfaces of the frame 11, which are at opposed positions, from below. Thereby, the frame 11, the first lower member 12 and the second lower member 13 are connected.

Then, the base member 14 is inserted into the upper part of the frame 11 from above. At this time, the locking projections (locked parts) 14a, which the outer side surfaces of the base member 14 are provided with, are locked to the locking parts 11b, which the inner peripheral surfaces of the frame 11 are provided with. Thereby, the base member 14 is stably held at the upper part of the frame 11. The upper cover 15 is put on the frame 11 which accommodates the base member 14. A large number of electric wires which are connected to the relays and fuses installed in the base member 14 are arranged in the frame 11 under the base member 14. At this time, the locking projections 15a of the upper cover 15 are locked to the locked parts 11a at the outer peripheral surfaces of the frame 11 which are at positions corresponding to the lock projections 15a, one for each. Thereby, the upper cover 15 is installed to the frame 11 without a wobble. Finally, the electrical junction box A as shown in FIG. 1 is formed.

In this case, in the unit storing room 20 which is defined by the separating wall 21 in the frame 11, the lower part is closed since a part of the lower end edges of the side walls 16 and 17 of the frame 11 and the lower end edge of the separating wall 21 are closely connected onto the rib 34 of the first lower member 12. The upper part is closed since a part of the lower end edges of the side walls 43 and 44 of the upper cover 15 and the separating wall 49 are closely connected to a part of the upper end edges of the side walls of the frame 11 and the upper end edge of the separating wall 21.

Therefore, the inside of the unit storing room 20 becomes a space which is thermally shielded from the inside and outside of the frame 11 except the unit storing room 20, and the thermal transfer between the unit storing room 20, which stores the electronic control unit 63, and the inside of the frame 11, which stores the connector-attached electric wires which are connected to the electronic control unit 63, is regulated.

In the electrical junction box A, the electric wires together with the base member 14 are stored in the frame 11 except the unit storing room 20. Ends of the electric wires and the connectors which are attached to the ends are inserted into the unit storing room 20 through the cut 35 of the first lower member 12 and the cut 24 which the separating wall 21 in the frame 11 is provided with. The connectors which are stored in the unit storing room 20 are fitted to the terminals of the electronic control unit prepared by the automobile manufacturer. Then, the electronic control unit is stored in the unit storing room.

The steps to store an electronic control unit 63 prepared by the automobile manufacturer in the unit storing room 20 of the frame 11 of the electrical junction box A are shown in FIGS. 19A to 19C. First, as shown in FIG. 19A, electric wires (harness) 62 attached with connectors 61 which are inserted inside the unit storing room 20 through the cut 24 and the cut 35 are lifted by fingers or a jig inserted from the side of the upper opening part of the unit storing room 20, and are installed (fitted) to the terminals (not shown in the figure) of the prepared electronic control unit 63.

Then, as shown in FIG. 19B, after the connectors 61 and the terminals at the side of the electronic control unit 63 are fitted surely, while the electric wires 62 are bended to a substantially U shape in the first lower member 12 and the unit storing room 20, the electronic control unit 63 is pushed into the unit storing room 20. The pushing operation is performed until the top surface of the electronic control unit 63 is sunk near the opening part of the unit storing room 20. Then, the upper cover 15 is put on the frame 11 from above the large number of electric wires, which are arranged inside the frame 11 except the unit storing room 20, and the base member 14, which is arranged above the electric wires as described above.

The step part 47 is formed to a circle shape on the inner side surfaces of the side walls 43 to 46 of the upper cover 15 at the sites of the same distance from the top part 42, and the step part 47 is formed to be supported by the upper edges of the side walls 16 to 19 of the frame 11. Therefore, the upper cover 15 is stably installed to the frame 11 while a part of the upper cover 15 overlaps the frame 11 in the horizontal direction. An extended wall 48 is extended downward from the side wall 44 and the part of the side wall 45 that is connected to the side wall 44. Therefore, when the upper cover 15 is installed to the frame as described above, the frame 11 is covered from outside.

Figure 16:
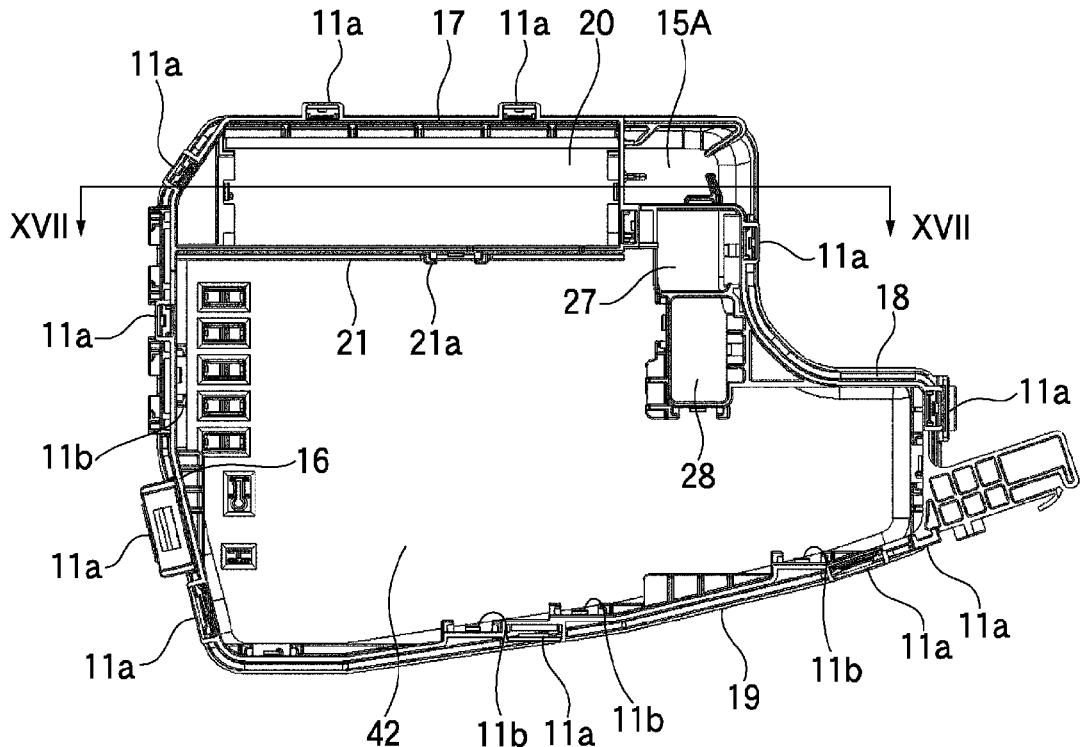
FIG. 16 is a bottom view of the frame and the upper cover, which are assembled, of the electrical junction box according to the embodiment of the present invention.

In addition, the upper cover 15 is formed with the separating wall 49 which is substantially U-shaped and which defines a rectangular space with the side wall 44. Therefore, as shown in FIGS. 16 and 17, when the frame 11 is covered by the upper cover 15, the lower end edge of the separating wall 49 contacts the upper end edge of the separating wall 21 at the side of the frame 11 so that the separating wall 49 forms a space together with the top part 42 to seal the unit storing room 20 of the frame 11 from above. As a result, while the inside of the unit storing room 20 is thermally shielded from the outside, when the upper cover 15 is pressed towards the frame 11, the separating wall 49 reinforces the top part 42 so that the top part 42 can be avoided from being unintentionally bended (dented).

As described above, the electrical junction box of the embodiment includes the frame 11 in which the storing box B is formed which has the unit storing room 20 in which the electronic control unit 63 is accommodated, and the upper cover 15 which is assembled to the side of the frame 11 where the accommodating port 20a, which becomes an entrance when the electronic control unit 63 is accommodated in the unit storing room, is formed so that the accommodating port 20a is closed. Therefore, according to the electrical junction box, the heat that the electronic control unit 63 accommodated in the unit storing room 20 produces can be prevented from leaking to the outside of the unit storing room 20, and it can be effectively avoided that insulation coatings of electric wires or electronic components, which are arranged outside the unit storing room 20, deteriorate thermally.

In this case, the upper cover 15 includes the upper cover body 15A which closes the side of the frame 11 where the accommodating port 20a is formed, and the separating wall 49 which is protruded to the frame 11 from the inner surface of the upper cover body 15A that faces the frame 11. Since the accommodating port 20a is covered by the upper cover body 15A and the separating wall 49, the accommodating port 20a can be closed by the upper cover 15 only in a limited range near the accommodating port 20a of the unit storing room. As a result, the volume of the sealed unit storing room 20 can be decreased, which can contribute to the downsizing of the electrical junction box A.

The separating wall 49 is protruded towards the inner edge 20b of the accommodating port 20a, and the distal end of the separating wall 49 contacts the inner edge 20b. Thereby, the volume of the sealed unit storing room 20 can be decreased, and the electrical junction box A can be further downsized. Because the distal end of the separating wall 49 is supported by the storing box B, if an external force towards the frame 11 is applied to the upper cover 15 which is assembled to the frame 11, the separating wall 49 itself produces a repelling force against the external force. As a result, the upper cover 15 can be prevented from being deformed.

The reinforcing ribs 49a of a ridge shape are formed on the separating wall 49 along the direction the upper cover 15 is assembled to the frame 11. Thereby, the strength of the separating wall 49 can be raised, and the repelling force that the separating wall 49 produces against an external force applied to the upper cover 15 increases. As a result, the upper cover 15 can be further prevented from being deformed.

In the above embodiment, the frame 11 is provided with the separating wall 21 and the upper cover 15 is provided with the separating wall 49, and when the accommodating port 20a of the unit storing room 20 is closed, the distal ends of these separating walls 21 and 49 contact each other. However, it is also possible that the separating wall 21 which defines the unit storing room 20 is provided with a protruding wall which protrudes from the upper end of the separating wall 21 towards the upper cover 15, and the distal end of the protruding wall contacts the inner surface of the upper cover 15 that faces the frame 11. According to the construction, without providing the separating wall on the upper cover 15, the unit storing room 20 can be sealed, and the upper cover 15 can be prevented from being deformed.

Although the invention is described in detail with reference to specific embodiments, it is apparent that various modifications and amendments may be made by those skilled in the art without departing from the spirit and scope of the invention.

This application is based on the Japanese patent application (patent application 2011-068353) filed on Mar. 25, 2011, whose content is incorporated herein by reference.

INDUSTRIAL APPLICABILITY

The present invention is useful in the fields of an electrical junction box which is carried in an automobile or the like and includes a unit storing room to accommodate an electronic control unit.

REFERENCE SIGNS LIST

A electrical junction box
B storing box
11 frame
11a locked part
11b locking part
12 first lower member
12a locking projection
12b locked part
13 second lower member
13a locking projection
13b locking projection
14 base member
14a locking projection (locked part)
15 upper cover
15a locking projection
15A upper cover boy
16, 17, 18, 19 side wall
20 unit storage room
20a accommodating port
20b inner edge
21 separating wall
21a locking part
22 cut
24 cut
26 rib
27, 28 connector storing frame
29 bottom part
30, 31, 32, 33 side wall
34 rib
35 cut
36 reinforcing rib
37, 38, 40 side wall
39 opening
41 bottom part
42 top part
43, 44, 45, 46 side wall
47 stepped part
48 extended wall
49 separating wall
49a reinforcing rib
61 connector
62 electric wires (harness)
63 electronic control unit

The invention claimed is:

1. An electrical junction box, comprising:
a frame comprising a first sidewall, a second sidewall and a frame separating wall, the first sidewall and the second sidewall defining a storing box, wherein at least a portion of the first sidewall and the frame separating wall define a unit storing room configured to accommodate an electronic control unit, the second sidewall being spaced apart from the unit storing room; and
an upper cover which is assembled to one side of the frame where an accommodating port is formed so that the upper cover closes the accommodating port, the accommodating port being an entrance for accommodating the electronic control unit in the unit storing room,
wherein the frame separating wall extends farther toward the upper cover in a cover-attachment direction than the second sidewall, and
wherein the first sidewall, the second sidewall and the frame separating wall at least partially overlap in a direction perpendicular to the frame separating wall.

2. The electrical junction box according to claim 1, wherein:
the upper cover includes an upper cover body which closes the side of the frame where the accommodating port is formed, and a cover separating wall which is protruded to the frame from an inner surface of the upper cover body opposing the frame, and
the accommodating port is covered by the upper cover body and the cover separating wall.

3. The electrical junction box according to claim 2, wherein:
the cover separating wall is protruded towards an edge of the frame separating wall, and
a distal end of the separating wall contacts the edge of the frame separating wall.

4. The electrical junction box according to claim 3, wherein the cover separating wall is formed with a reinforcing rib having a ridge shape along a direction in which the upper cover is assembled to the frame.

5. The electrical junction box according to claim 1, wherein:
a distal end of the first sidewall in the cover-attachment direction contacts an inner surface of the upper cover opposing the frame, the distal end extending farther toward the upper cover than the second sidewall in the cover-attachment direction, and
wherein the first sidewall and the second sidewall define exterior sidewalls of the electrical junction box.

6. The electrical junction box according to claim 5, the first sidewall comprising another distal end in the cover-attachment direction opposite to the distal end, the other distal end of the first sidewall extending farther away from the upper cover than the second sidewall.

7. The electrical junction box according to claim 1, wherein the frame separating wall and a further frame separating wall separate the unit storing room from a connector storing frame, the further frame separating wall being disposed in an interior of the electrical junction box.

* * * * *